United States Patent
Wu

(10) Patent No.: US 6,489,237 B1
(45) Date of Patent: Dec. 3, 2002

(54) METHOD OF PATTERNING LINES IN SEMICONDUCTOR DEVICES

(75) Inventor: Hua-Shu Wu, Hsinchu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 10/003,843

(22) Filed: Dec. 4, 2001

(51) Int. Cl.⁷ ............................................... H01L 21/44
(52) U.S. Cl. ......................................... 438/671; 438/673
(58) Field of Search ............................. 438/670–679, 438/760–769, 669

(56) References Cited

U.S. PATENT DOCUMENTS

| | | | |
|---|---|---|---|
| 4,496,419 A | 1/1985 | Nulman et al. | 156/643 |
| 4,702,792 A | 10/1987 | Chow et al. | 156/628 |
| 4,759,822 A | 7/1988 | Vetanen et al. | 156/644 |
| 4,954,218 A | 9/1990 | Okumura et al. | 156/643 |
| 5,371,410 A * | 12/1994 | Chen et al. | 257/750 |
| 5,888,904 A | 3/1999 | Wu | 438/682 |
| 6,100,014 A | 8/2000 | Lin et al. | 430/314 |
| 6,103,623 A * | 8/2000 | Lien et al. | 438/636 |
| 6,239,008 B1 | 5/2001 | Yu et al. | 438/587 |
| 6,268,287 B1 * | 7/2001 | Young et al. | 438/671 |

* cited by examiner

Primary Examiner—Chandra Chaudhari
Assistant Examiner—David Hogans
(74) Attorney, Agent, or Firm—George O. Saile; Stephen B Ackerman

(57) ABSTRACT

A new process is provided for the creation of sub-micron conductive lines and patterns. A conductive layer is deposited over the surface of a substrate, a sacrificial layer that differs with the conductive layer in etch characteristics is deposited over the surface of the conductive layer. The sacrificial layer is patterned and etched, creating an opening in the sacrificial layer that aligns with but is larger in cross section than the to be created sub-micron conductive lines and patterns. A spacer layer is deposited over the surface of which a hard mask layer is deposited, filling the opening in the sacrificial layer. The hard mask layer is polished down to the surface of the spacer layer, leaving the hard mask layer in place overlying the spacer layer inside the opening created in the sacrificial layer. Using the hard mask layer as a mask, the spacer layer, the sacrificial layer and the conductive layer are etched, leaving in place the hard mask layer overlying the etched spacer layer, which overlies the etched conductive layer. The etched conductive layer now has a cross section that equals the cross section of the hard mask layer. Removing the hard mask layer and the spacer layer leaves the conductive layer in place, having a cross section that is significantly smaller than the cross section of a conventionally created sub-micron conductive lines and patterns.

13 Claims, 3 Drawing Sheets

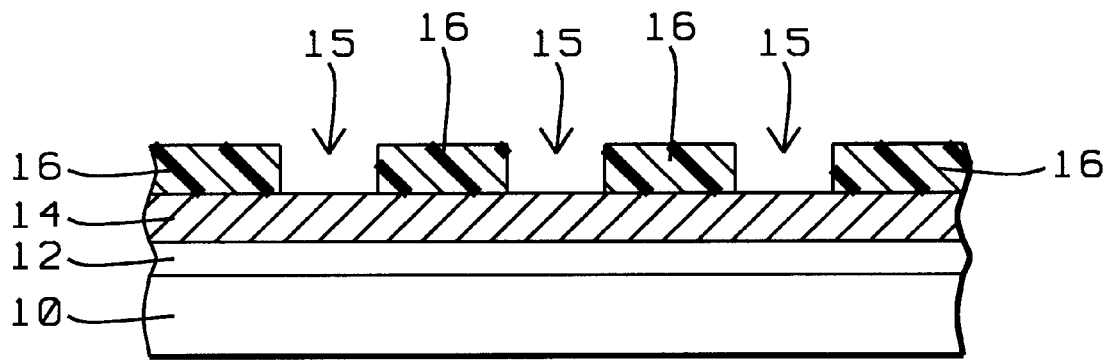
FIG. 1 — Prior Art
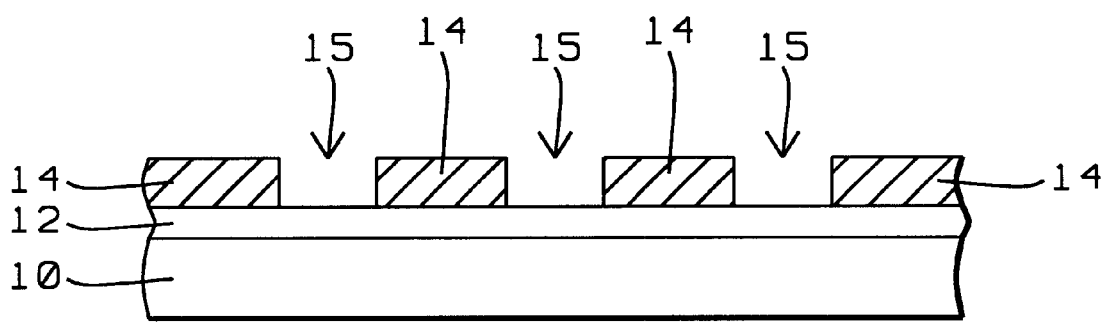
FIG. 2 — Prior Art

METHOD OF PATTERNING LINES IN SEMICONDUCTOR DEVICES

BACKGROUND OF THE INVENTION (1) Field of the Invention

The invention relates to the fabrication of integrated circuit devices, and more particularly, to a method for creating very fine lines as part of the process of creating semiconductor devices.

(2) Description of the Prior Art

The continued effort to reduce device dimensions and to therewith improve device electrical performance requires high accuracy formation of conductive lines, conductive patterns and conductive connectors of sub-micron dimensions. These sub-micron conductive elements may be elements of an individual semiconductor device or may be elements that form conductive interconnects between co-functional semiconductor devices within one larger package.

A conventional process for creating sub-micron conductive lines and patterns uses a lift-off process. This process is briefly highlighted using FIGS. 1 and 2.

Shown in the cross section of FIG. 1 are the following elements:

- 10, the surface of a substrate, typically a monocrystalline silicon substrate
- 12, a layer of insulation that is created over the surface of substrate 10
- 14, a layer of conductive material in which the sub-micron conductive lines and patterns are to be created; the conductive material 14 can comprise metal, polysilicon, amorphous silicon or any other semiconductor compatible conductive layer
- 16, a layer of exposure sensitive material that is used for the creation of an etch mask over the surface of layer 14; layer 16 typically comprises photoresist, which can be developed by exposing the irradiated surface of layer 16 to a solvent that is capable of dissolving the irradiated portion (that is a positive-tone photoresist has been used) or that that is capable of dissolving the non-irradiated portion (that is a negative-tone photoresist has been used).

The preferred technology that is applied for the creation of the openings 15 in layer 16 of exposure sensitive material is photolithography. Key parameters in this exposure's the cross section of openings 15, that is the feature width of the created sub-micron conductive lines and patterns, and the distance between openings 15, which is the separation of the created sub-micron conductive lines and patterns. Significant improvements in the art of photolithography have enabled continued reduction of the critical dimensions of the sub-micron conductive lines and patterns. Efforts continue to be dedicated to improvements of photolithographic technology. These efforts have led to for instance the use of and improvements of phase shifting masks and alternate phase shifting masks, which reduce proximity effects of the light beams that are used for the exposure of an exposure sensitive surface such as the surface of layer 16, FIG. 1, of photoresist. These efforts however result in significant increases in the cost of creating semiconductor devices, which is a trend that must be avoided in the highly cost-sensitive and competitive semiconductor manufacturing industry.

Another approach that has been used to create sub-micron conductive lines and patterns is to increase the frequency of the source of energy that is used with photolithography processes. As such have been applied the use of I-line (365 nm) exposure, combined with high-resolution photoresist and the use of Deep UV (248 nm) exposure. Both of these methods however result in an increased manufacturing cost.

The sub-micron conductive lines and patterns of FIG. 1 are created by etching (lifting-off) the underlying conductive layer 14, FIG. 1, in accordance with the pattern that has been created in the exposure sensitive layer 16, after which the mask 16 can be removed from the surface of the created pattern 14, FIG. 2.

The invention provides a method that addresses the above stated concerns relating to the creation of sub-micron conductive lines and patterns by using photolithography technology. The method of the invention alleviates requirements that are typically imposed on the equipment that is used during the process of photolithographic exposure for the creation of sub-micron conductive lines and patterns.

U.S. Pat. No. 6,100,014 (Lin et al.) shows a photo process to form a small opening using spacer on a resist layer.

U.S. Pat. No. 6,239,008 (Yu) shows a photo process to form a dense pattern by a double deposition process.

U.S. Pat. No. 4,702,792 (Chow et al.), U.S. Pat. No. 5,888,904 (Wu), U.S. Pat. No. 4,496,419 (Nulman et al.), U.S. Pat. No. 4,954,218 (Okumura et al.), U.S. Pat. No. 4,759,822 (Vetanen et al.) are related processes.

SUMMARY OF THE INVENTION

A principle objective of the invention is to create sub-micron conductive lines and patterns using a cost-competitive method.

Another objective of the invention is to alleviate requirements that are typically imposed on photolithographic equipment that is used for the creation of sub-micron conductive lines and patterns.

In accordance with the objectives of the invention a new process is provided for the creation of sub-micron conductive lines and patterns. A conductive layer is deposited over the surface of a substrate, a sacrificial layer that differs with the conductive layer in etch characteristics is deposited over the surface of the conductive layer. The sacrificial layer is patterned and etched, creating an opening in the sacrificial layer that aligns with but is larger in cross section than the to be created sub-micron conductive lines and patterns. A spacer layer is deposited over the surface of which a hard mask layer is deposited, filling the opening in the sacrificial layer. The hard mask layer is polished down to the surface of the spacer layer, leaving the hard mask layer in place overlying the spacer layer inside the opening created in the sacrificial layer. Using the hard mask layer as a mask, the spacer layer, the sacrificial layer and the conductive layer are etched, leaving in place the hard mask layer overlying the etched spacer layer, which overlies the etched conductive layer. The etched conductive layer now has a cross section that equals the cross section of the hard mask layer. Removing the hard mask layer and the spacer layer leaves the conductive layer in place, having a cross section that is significantly smaller than the cross section of a conventionally created sub-micron conductive lines and patterns.

BRIEF DESCRIPTION OF THE DRAWINGS

FIGS. 1 and 2 show conventional processing steps for the creation of sub-micron conductive lines and patterns.

FIG. 3 shows a cross section of the surface of a substrate, a conductive layer has been deposited over the surface of the substrate.

FIG. 4 shows a cross section of the surface of a substrate after a patterned and etched sacrificial layer has been created over the conductive layer.

FIG. 5 shows a cross section of the surface of a substrate after a spacer layer and a hard mask layer have been deposited over the patterned and etched sacrificial layer.

FIG. 6 shows a cross section of the surface of a substrate after the hard mask layer has been polished down to the surface of the spacer layer.

FIG. 7 shows a cross section of the surface of a substrate after the spacer layer, the sacrificial layer and the conductive layer have been etched in accordance with the hard mask layer of FIG. 6.

FIG. 8 shows a cross section of the surface of a substrate after the hard mask layer and the spacer layer have been removed from above the surface of the conductive layer.

DESCRIPTION OF THE PREFERRED EMBODIMENTS

Figure 3:
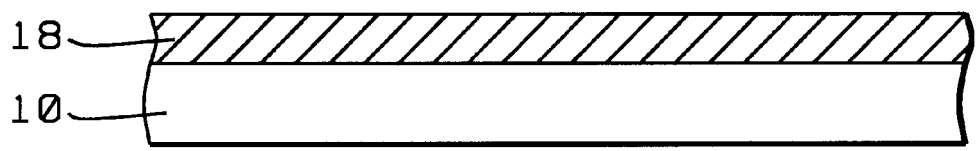
FIGS. 3 through 8 show the processing steps of the invention, as follows.

Referring now specifically to FIG. 3, there is shown a cross section of:

10, the surface of a substrate, typically a monocrystalline silicon substrate 18, a layer of conductive semiconductor material comprising a material such as metal, polysilicon, amorphous silicon a doped dielectric or any other semiconductor compatible conductive layer.

It must at this time be emphasized that the invention is not limited to semiconductor materials in the strict sense of the word but can be applied to any overlying layers of material that are characterized as having different etching rates. It can therefore be stated that the term semiconductor material that is used in the following descriptions can be a material that is selected from the group consisting of insulating materials and dielectric materials and conductive materials and passivation materials and Anti Reflective Coating (ARC) materials and etch stop materials and resist materials.

The surface 10, although typically a monocrystalline silicon substrate, is not limited to being the surface of a silicon substrate but can be selected from the group of surfaces consisting of semiconductor substrates, printed circuit boards, flex circuits, metallized substrates, glass substrates and semiconductor device mounting supports, ceramic substrates, gallium arsenide substrates, silicon substrates comprising a single layer of material, such as a silicon wafer or comprising silicon on insulator (SOI) technology and silicon on sapphire (SOS) technology, doped and undoped semiconductors, epitaxial layers of silicon supported by a base semiconductor and substrates used for flat panel displays.

Figure 4:
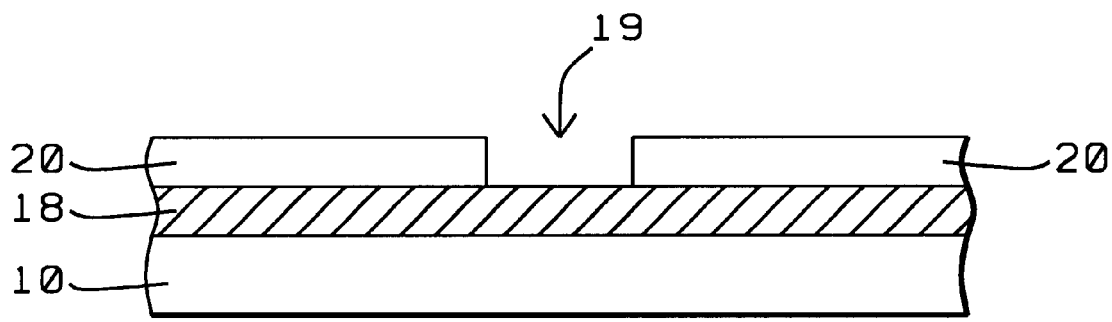

Continuing with the invention there is shown in the cross section of FIG. 4:

20, a sacrificial layer of semiconductor material, such as insulating or passivation or dielectric material, with the only requirement being that the etch selectivity characteristics of layer 18, FIG. 3, and layer 20, FIG. 4, are different. This in order to control and enable subsequent steps of creating the sub-micron conductive lines and patterns of the invention.

An example is layer 18 may comprise polysilicon while layer 20 comprises silicon dioxide ($SiO_2$).

Layer 20 of sacrificial semiconductor material has been patterned and etched using conventional methods of photolithography whereby the requirements that are placed on this step of photolithographic exposure are that minimum dimensions for the opening 19 are created at a reasonable cost of creating the opening 19. This implies that cost savings can be realized during this step of photolithographic exposure since, in accordance with the instant invention, the photolithographic exposure can be performed under conditions of less stringent requirements and therefore under conditions of less than extreme state of the art equipment and less than extreme operating conditions.

The photolithographic exposure for the creation of a lift-off or etch mask over layer 20, which is required for the creation of opening 19 in layer 20, is applied such that the cross section of opening 19 is as small as possible and can therefore make use of DUV exposure, which further can be combined with the use of phase shifting masks and alternate phase shifting masks. High-resolution photoresist can further be applied as a mask for the exposure of layer 20.

Figure 5:
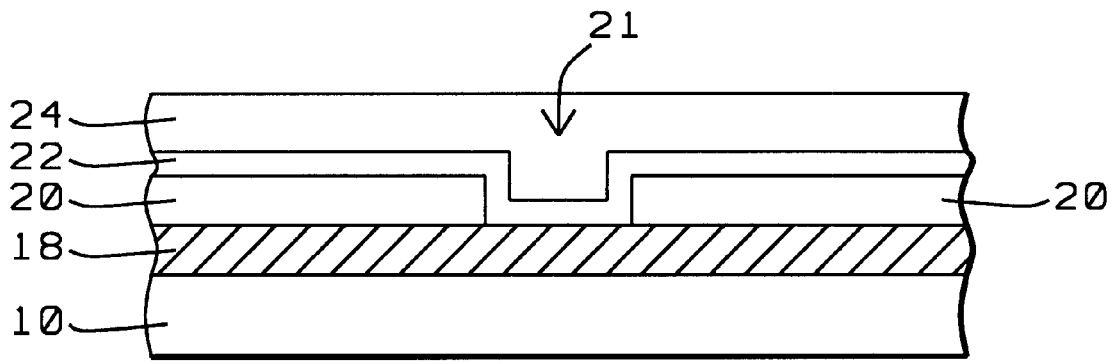

FIG. 5 shows a cross section whereby has been deposited:

22, a spacer layer; layer 22 can comprise any semiconductor material that meets the requirements that (1) the etch selectivity characteristics of layer 22 and layer 18 are different and (2) layer 22 must have conformal deposition characteristics. The need for this latter requirement becomes apparent when it is realized that good control of the deposition of layer 22 is necessary for and results in good control of the line width of the created conductive line and pattern of the invention. The material that is selected for layer 22 may be the same material as the material that is applied for layer 20

24, a layer of hard mask material; layer 24 must comprise material that is chemically different from the material that is used for layers 20 and 22 in order to maintain required etch selectivity of the overlying layers.

While the etch selectivity of the various layers such as layers 20, 22 and 24 have been indicated as preferably being different, it must be emphasized that this is not a binding requirement of the invention so that one or more of these layers can be selected having equal etch selectivity.

The term "hard mask" material is known in the art as referring to an inorganic masking material. The layer of hard mask is preferably of silicon dioxide obtained from TEOS. The TEOS is deposited by CVD or PE-CVD, typically to a thickness of about 100 to about 1,000 Angstrom and more typically to a thickness between about 400 and 600 Angstrom. The TEOS is reacted with oxygen or ozone to provide the silicon oxide hard mask material. Other less preferred hard mask material include phosphosilicate glass (PSG), borophosphosilicate (BPSI), silicon oxynitride and thermally grown silicon dioxide.

From the cross section that is shown in FIG. 5 it is clear that the layer 24 of hard mask material must be deposited to a thickness such that the opening 21, overlying the spacer layer 22, is filled by the layer 24 of hard mask material.

Figure 6:
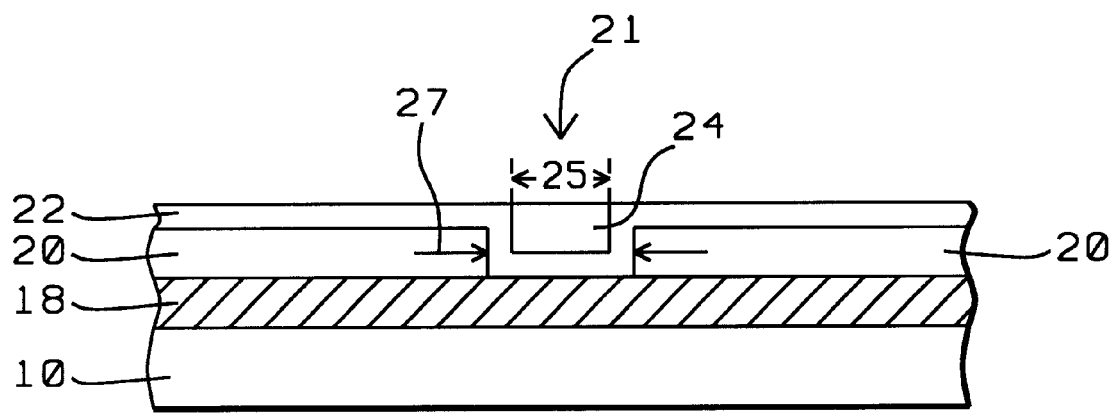

FIG. 6 shows a cross section of the substrate 10 after the layer 24, of hard mask material has been polished down to the surface of the layer 22 of spacer material. The preferred method that is to be applied for this process of polishing layer 24 is Chemical Mechanical Polishing (CMP). This is a standard polishing method that readily integrates into conventional manufacturing methods and procedures. The hard mask layer 24 is now present inside opening 21, having a cross section 25. It must be noted that this cross section 25 is less that cross section 27. The latter cross section, as can be confirmed by referring back to FIG. 4, has been created using photolithographic exposure techniques. These latter techniques as applied by the instant invention can, as indicated above, be of more relaxed requirements. The invention, while applying the best available photolithographic exposure techniques (DUV exposure, phase shifting and alternate phase shifting mask, high-resolution photoresist), including considerations of cost, provides submicron conductive lines and patterns having reduced cross sections.

Figure 7:
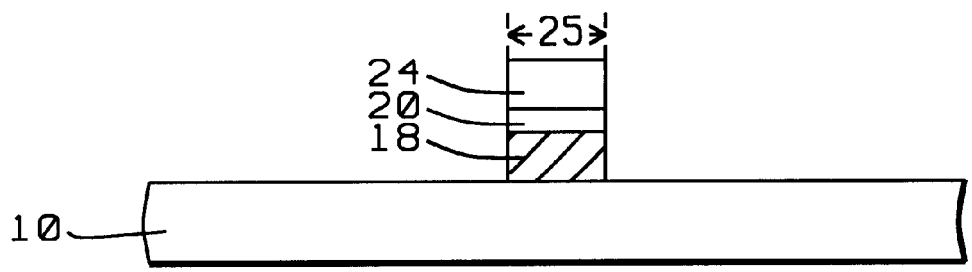

FIG. 7 shows a cross section after the layers 22, 20 and 18 have been removed from above the surface of substrate 10 where these layers are not shielded by the hard mask layer 24. Cross section 25 remains in effect, meaning that the beneficial reduction in dimensions that are provided by the invention remain in effect.

For the removal of layers 22, 20 and 18 a dry etch process is preferred since such a process provides anisotropic vertical edges of the layers 24, 20 and 18 after these layers have been etched in accordance with the pattern of the hark mask 24.

Figure 8:
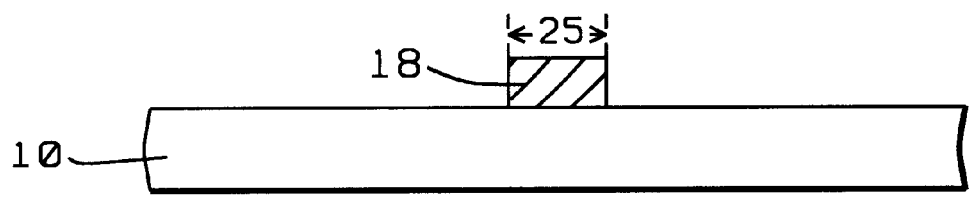

Remains to remove layer 24 of hard mask material and layer 20 of spacer material from the surface of the etched layer 18 of conductive material. The results of this removal have been shown in cross section in FIG. 8. The final benefit that is provided by the invention is emphasized by the highlighted dimension 25, which, as is clear from the cross section of FIG. 6, is less than the dimension 27 by a measurable amount. Dimension 27 is imposed by considerations of cost and photolithographic processing capabilities, the reduction in cross section from cross section 27 to cross section 25 is provided by the invention at no added cost to the applied photolithographic process and equipment.

It will be appreciated that substantially no specific materials have been highlighted in the description of the invention since the materials that are used by the invention can be of a wide variety while only the indicated mutual characteristics of etch selectivity are of importance to the invention. Where these characteristics are germane to the invention, these characteristics in addition to others have been highlighted.

The invention of patterning lines in semiconductor devices can be summarized as follows:

a semiconductor surface is provided a layer of semiconductor compatible conductive material having
  a first etch selectivity is deposited over the semiconductor surface a first layer of semiconductor material having second etch selectivity is deposited over the layer of semiconductor compatible conductive material, the second etch selectivity and the first etch selectivity being different at least one opening having inside surfaces is created in the first layer of semiconductor material, the at least one opening aligning with the lines being patterned, the at least one opening having a cross section that exceeds a cross section of the lines being patterned by a measurable amount a second layer of semiconductor material having a third etch selectivity is deposited over the first layer of semiconductor material including the inside surfaces of the opening created in the first layer of semiconductor material, the third etch selectivity and the second etch selectivity and the first etch selectivity being different a layer of hard mask material having a fourth etch selectivity is deposited over the surface of the second layer of semiconductor material, the fourth etch selectivity and the third etch selectivity and the second etch selectivity and the first etch selectivity being different, at least filling the at least one opening created in the first layer of semiconductor material the hard mask material is polished down to the surface of the second layer of semiconductor, leaving the hard mask material inside the at least one opening created in the first layer of semiconductor material, forming an etch mask the second layer of semiconductor material, the first layer of semiconductor material and the layer of semiconductor compatible conductive material are removed in accordance with the etch mask, leaving in place patterned layers of second semiconductor material in addition to a patterned layer of semiconductor compatible conductive material, and the etch mask and the patterned layer of second semiconductor material are removed from the surface of the patterned layer of semiconductor compatible conductive material.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of patterning lines in semiconductor devices, comprising the steps of:

providing a semiconductor surface;

depositing a layer of semiconductor compatible conductive material having a first etch selectivity over said semiconductor surface;

depositing a first layer of semiconductor material having second etch selectivity over said layer of semiconductor compatible conductive material, said second etch selectivity and said first etch selectivity being different;

creating at least one opening having inside surfaces in said first layer of semiconductor material, said at least one opening aligning with said lines being patterned, said at least one opening having a cross section that exceeds a cross section of said lines being patterned by a measurable amount;

depositing a second layer of semiconductor material having a third etch selectivity over said first layer of semiconductor material including said inside surfaces of said opening created in said first layer of semiconductor material, said third etch selectivity and said second etch selectivity and said first etch selectivity being different;

depositing a layer of hard mask material having a fourth etch selectivity over the surface of said second layer of semiconductor material, said fourth etch selectivity and said third etch selectivity and said second etch selectivity and said first etch selectivity being different, at least filling said at least one opening created in said first layer of semiconductor material;

polishing said hard mask material down to the surface of said second layer of semiconductor, leaving said hard mask material inside said at least one opening created in said first layer of semiconductor material, forming an etch mask;

removing said second layer of semiconductor material, said first layer of semiconductor material and said layer of semiconductor compatible conductive material in accordance with said etch mask, leaving in place patterned layers of second semiconductor material in addition to a patterned layer of semiconductor compatible conductive material; and removing said etch mask and said patterned layer of second semiconductor material from the surface of said patterned layer of semiconductor compatible conductive material.

2. The method of claim 1 wherein said creating at least one opening having inside surfaces in said first layer of semiconductor material comprises applying methods of photolithography.

3. The method of claim 2 wherein said methods of photolithography comprises applying Deep Ultra Violet (DUV) exposure.

4. The method of claim 2 wherein said methods of photolithography comprises applying a phase shift mask.

5. The method of claim 2 wherein said methods of photolithography comprises applying an alternate phase shift mask.

6. The method of claim 2 wherein said methods of photolithography comprises applying Deep Ultra Violet (DUV) exposure or applying a phase shift mask or applying an alternate phase shift mask or applying any combination thereof.

7. The method of claim 1, said fourth, third, second and first etch sensitivities being selected such that one or more of these etch sensitivities are equal.

8. The method of claim 1, said semiconductor surface being selected from the group of surfaces consisting of semiconductor substrates, printed circuit boards, flex circuits, metallized substrates, glass substrates and semiconductor device mounting supports, ceramic substrates, gallium arsenide substrates, silicon substrates comprising a single layer of material, such as a silicon wafer or comprising silicon on insulator (SOI) technology and silicon on sapphire (SOS) technology, doped and undoped semiconductors, epitaxial layers of silicon supported by a base semiconductor and substrates used for flat panel displays.

9. The method of claim 1, said second layer of semiconductor material being selected as having conformal deposition characteristics.

10. The method of claim 1 wherein said polishing said hard mask material down to the surface of said second layer of semiconductor comprises applying methods of Chemical Mechanical Polishing.

11. The method of claim 1 wherein said removing said second layer of semiconductor material, said first layer of semiconductor material and said layer of semiconductor compatible conductive material in accordance with said etch mask comprises applying a dry etch process.

12. The method of claim 1, said layer of semiconductor compatible conductive material comprising a material selected from the group consisting of metal and polysilicon and amorphous silicon.

13. The method of claim 1, said semiconductor material being selected from the group consisting of insulating materials and dielectric materials and conductive materials and passivation materials and Anti Reflective Coating (ARC) materials and etch stop materials and resist materials.

* * * * *